United States Patent
Shah et al.

(10) Patent No.: US 8,457,806 B2
(45) Date of Patent: Jun. 4, 2013

(54) MANAGING AN INFRASTRUCTURE HAVING A 3D PACKAGE AND COOLING RESOURCE ACTUATORS

(75) Inventors: Amip J. Shah, Santa Clara, CA (US); Chandrakant Patel, Fremont, CA (US); Ratnesh Kumar Sharma, Fremont, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 266 days.

(21) Appl. No.: 12/790,436

(22) Filed: May 28, 2010

(65) Prior Publication Data
US 2011/0295443 A1 Dec. 1, 2011

(51) Int. Cl.
G05D 23/00 (2006.01)
H05K 7/20 (2006.01)

(52) U.S. Cl.
USPC .................................... 700/300; 361/679.53

(58) Field of Classification Search
USPC .................. 700/300, 276, 278, 299; 713/322; 361/679.53, 688, 700, 709, 716, 719
See application file for complete search history.

(56) References Cited

U.S. PATENT DOCUMENTS

| | | | | |
|---|---|---|---|---|
| 7,274,568 B1 * | 9/2007 | Chayut | ......................... | 361/699 |
| 7,421,601 B2 * | 9/2008 | Bose et al. | .................... | 713/320 |
| 7,557,438 B2 * | 7/2009 | Chrysler et al. | .............. | 257/686 |
| 7,617,360 B2 * | 11/2009 | Arai et al. | ..................... | 711/114 |
| 7,701,252 B1 * | 4/2010 | Chow et al. | ..................... | 326/41 |
| 8,064,197 B2 * | 11/2011 | Mowry et al. | ............. | 361/679.53 |
| 2009/0271646 A1 * | 10/2009 | Talwar et al. | ................. | 713/322 |
| 2011/0029153 A1 * | 2/2011 | Shah et al. | .................... | 700/300 |
| 2011/0029154 A1 * | 2/2011 | Shah et al. | .................... | 700/300 |
| 2012/0030493 A1 * | 2/2012 | Cepulis et al. | ............... | 713/324 |
| 2012/0039041 A1 * | 2/2012 | Mowry et al. | ................. | 361/695 |

FOREIGN PATENT DOCUMENTS
WO    WO 2009123621 A1 * 10/2009

* cited by examiner

*Primary Examiner* — Dave Robertson

(57) ABSTRACT

An apparatus for managing an infrastructure having one or more three-dimensional (3D) packages and a plurality of cooling resource actuators, each of the 3D packages including a plurality of heat sources, includes a heat source manager configured to determine heat load profiles of the heat sources. The apparatus also includes a cooling resource manager configured to determine capabilities of the plurality of cooling resource actuators to meet heat load demands of the plurality of heat sources based on the heat load profiles of the plurality of heat sources and an integrated thermal manager configured to match the capabilities of the plurality of cooling resource actuators to the heat load profiles of the plurality of heat sources.

20 Claims, 7 Drawing Sheets

MANAGING AN INFRASTRUCTURE HAVING A 3D PACKAGE AND COOLING RESOURCE ACTUATORS

CROSS REFERENCE TO RELATED APPLICATION

The present application shares some common disclosure with PCT application serial number PCT/US08/59020, entitled "Management of a 3D Package and Cooling System", filed on Apr. 1, 2008, and PCT application serial number PCT/US08/59008, entitled "Cooling Provisioning Management in a Three-Dimensional Package", filed on Apr. 1, 2008, the disclosures of which are hereby incorporated by reference in their entireties.

BACKGROUND

Recent trends in semiconductor technology have been focused towards miniaturization of integrated circuit chip systems. This has resulted in the development of high density electronic package modules, such as, three-dimensional (3D) multi-die structures, which are composed of a plurality of die that are arranged in a stack to substantially reduce the amount of floorspace that the die occupy in a system. As with conventional die, part of the electrical energy for driving the stacked die is converted into thermal energy and dissipated as heat. The temperatures of the die greatly affect their performance. As such, effective heat removal is typically an important consideration in designing and operating the 3D multi-die electronic package modules.

Heat is typically removed from the die through use of passive cooling provisioning, such as, thermally conductive material positioned to convey heat from one die to another die or to a heat sink. Techniques for actively cooling the die have also been proposed through use of thermoelectric coolers having a P-type material plate and an N-type material plate mounted between various die. However, as the electronic package modules continue to become more dense with die having ever-increasing operational speeds, conventional techniques for dissipating the heat generated by the die in 3D multi-die electronic package modules may be unable to adequately cool the die, which may lead to reduced performance and early failure. Additional challenges in controlling the removal of heat arise when multiple 3D multi-die electronic package modules are arranged together.

BRIEF DESCRIPTION OF THE DRAWINGS

Features of the present invention will become apparent to those skilled in the art from the following description with reference to the figures, in which.

DETAILED DESCRIPTION

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

Disclosed herein are an apparatus and a method for managing an infrastructure having one or more three-dimensional (3D) packages and a plurality of cooling resource actuators, each of the 3D packages including a plurality of heat sources. As used herein, a "3D package" may comprise multiple die within a single package, such as a stacked chip-scale package, multiple heat sources from a single die, such as, a multi-core processor, etc. As such, each of the heat sources discussed herein may comprise a die, a processor contained on a die, a core of a multicore processor, etc.

Through implementation of the method and apparatus disclosed herein, infrastructures containing 3D packages, including high-density 3D stacked packages, and heterogeneous cooling resource actuators, may be operated in relatively energy-efficient manners. In addition, the method and apparatus disclosed herein provide for improved redundancy and uptime relative to traditional single-failure or N+1 cooling designs. Moreover, the method and apparatus disclosed herein may be adapted to be implemented in various types of infrastructures, including, notebook computers, desktop computers, workstations, rack-mounted servers, blade servers, etc.

Figure 1:
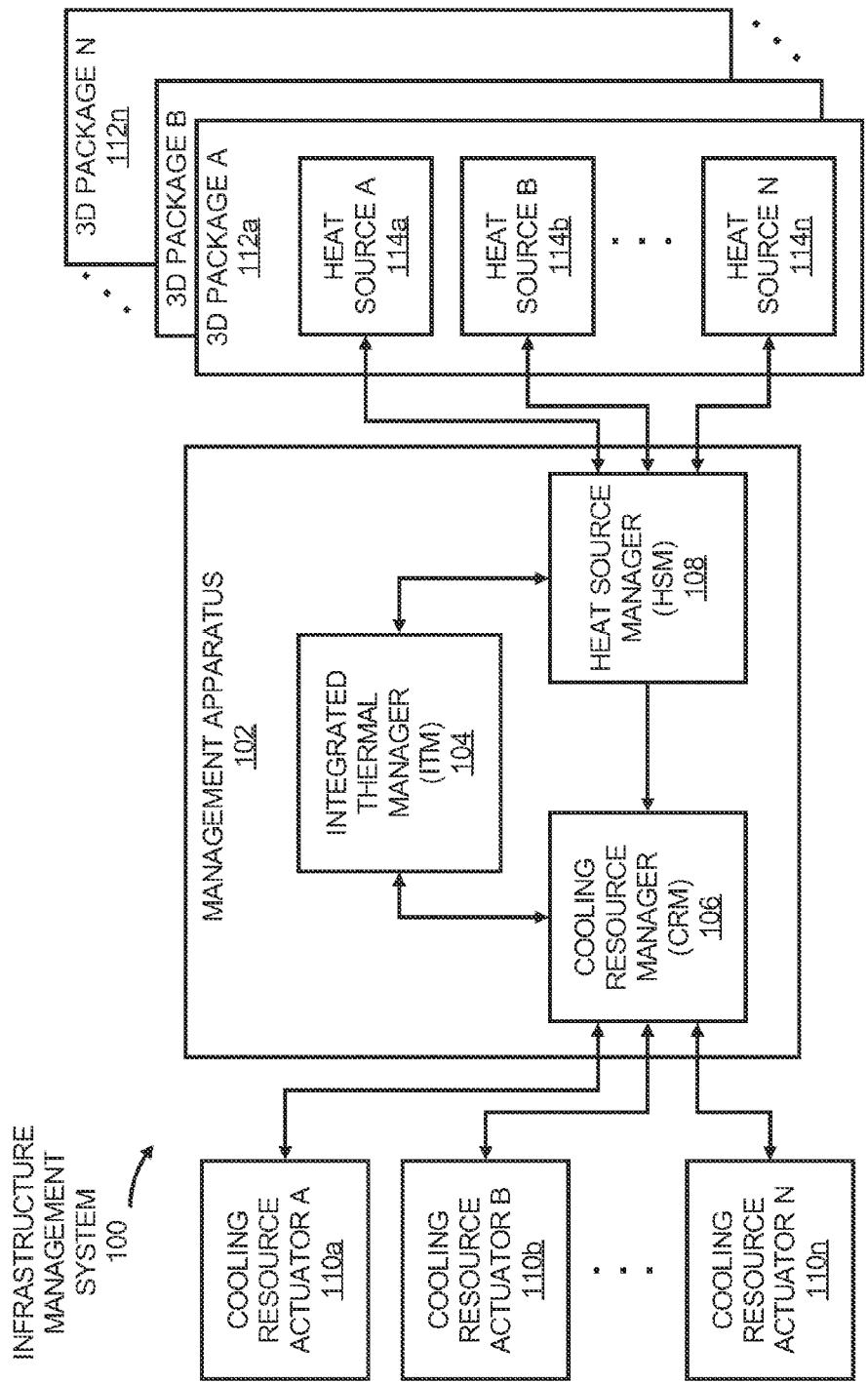
FIG. 1 shows a block diagram of a system for managing an infrastructure having one or more 3D packages and cooling resource actuators, each of the 3D packages including heat sources, according to an embodiment of the invention.

With reference first to FIG. 1, there is shown a block diagram of a system 100 for managing an infrastructure having one or more three-dimensional (3D) packages 112a-112n and a plurality of cooling resource actuators 110a-110n, each of the 3D packages including a plurality of heat sources 114a-114n, according to an example. It should be understood that the system 100 may include additional components and that one or more of the components described herein may be removed and/or modified without departing from a scope of the system 100.

Generally speaking, the system 100 comprises a management apparatus 102, cooling resource actuators 110a-110n and 3D packages 112a-112n. The ellipses in FIG. 1 denote that there may be additional cooling resource actuators and/or 3D packages. In addition, each of the 3D packages 112a-112n is depicted as including one or more heat sources 114a-114n. Generally speaking, the heat sources 114a-114n are configured to perform one or more computing and/or data processing operations. According to one embodiment, one or more of the 3D packages 112a-112n comprise a stacked die structure. In another embodiment, one or more of the 3D packages 112a-112n comprise a stacked chip-scale package and the heat sources 114a-114n of the one or more 3D packages 112a-112n comprise die. In a further embodiment, one or more of the 3D packages 112a-112n comprise die and the heat sources 114a-114n comprise processors. In a yet further embodiment, one or more of the 3D packages 112a-112n comprise multi-core processors and the heat sources 114a-114n comprise cores of the multi-core processors.

The cooling resource actuators 110a-110n generally comprise actuators configured to variably provide cooling resources to one or more of the 3D packages 112a-112n generally and/or to the heat sources 114a-114n specifically. The cooling resource actuators 110a-110n may variably provide the cooling resources based upon their respective settings. In one embodiment, the cooling resource actuators 110a-110n comprise heterogeneous actuators with respect to each other. In this embodiment, the cooling resource actuators 110a-110n may be configured to supply cooling resources, such as, cooling airflow, chilled water, refrigerant, other forms of heat removal, etc., to different ones of the heat sources 114a-114n. In addition, or alternatively, some of the cooling resource actuators 110a-110n may be arranged hierarchically with respect to each other such that, for instance, one of the cooling resource actuators 110a is configured to supply cooling resources to a number of heat sources 114a-114n while another one of the cooling resource actuators 110b is configured to supply cooling resources to one of the heat sources 114a. Various examples of the cooling resource actuators 110a-110n and the 3D packages 112a-112n are described in greater detail herein below with respect to FIGS. 2-5.

The management apparatus 102 is depicted as including an integrated thermal manager (ITM) 104, a cooling resources manager (CRM) 106, and a heat source manager (HSM) 108. In one example, the management apparatus 102 comprises one or more of the 3D packages 112a-112n or one or more of the heat sources 114a-114n in one or more of the 3D packages 112a-112n. In this example, one or more of the ITM 104, CRM 106, and the HSM 108 comprises a hardware device, such as a circuit or chip, on one or more of the 3D packages 112a-112n. In another example, the management apparatus 102 comprises a computing device or processor remotely located from the 3D packages 112a-112n. In a further example, the management apparatus 102 comprises a computer readable storage medium containing software, that when implemented, is configured to perform various operations with respect to the cooling resource actuators 110a-110n and/or the 3D packages 112a-112n.

The HSM 108 is configured to determine heat load profiles of the heat sources 114a-114n within one or more of the 3D packages 112a-112n. For instance, the HSM 108 may determine heat dissipation levels of the heat sources 114a-114n in one or more of the 3D packages 112a-112n through a direct measurement obtained by one or more sensors (not shown) or through an estimation based upon workloads being performed by the heat sources 114a-114n. In addition, the HSM 108 may predict heat dissipation levels of the heat sources 114a-114n based upon workloads that are anticipated to be placed on the heat sources 114a-114n. The HSM 108 is further configured to communicate the determined and/or predicted heat load profiles of the heat sources 114a-114n to the ITM 104.

The HSM 108 may further be configured to allocate workloads among the heat sources 114a-114n to manage the heat load profiles of the heat sources 114a-114n of one or more of the 3D packages 112a-112n. By way of example, the HSM 108 may allocate workload among the heat sources 114a-114n of one or more of the 3D packages 112a-112n to cause the heat load profiles of the heat sources 112a-112n to be within predetermined ranges. The predetermined ranges may be based upon manufacturer recommended values or alternately determined through testing of the heat sources 114a-114n. Additionally, the HSM 108 provides the heat load profiles of the heat sources 114a-114n to the CRM 106 either directly or through the ITM 104.

The CRM 106 is configured to determine capabilities of the cooling resource actuators 110a-110n to meet heat load demands of the heat sources 114a-114n based on the heat load profiles of the heat sources 114a-114n of the one or more of the 3D packages 112a-112n. For instance, the CRM 106 may evaluate whether the cooling resource actuators 110a-110n, operated on various levels, are capable of meeting the actual or projected heat load demands of the heat sources 114a-114n as determined by the HSM 108. The CRM 106 is further configured to communicate the determined capabilities of the cooling resource actuators 110a-110n to the ITM 104.

The ITM 104 is configured to match the capabilities of the cooling resource actuators 110a-110n to the heat load profiles of the heat sources 114a-114n in one or more of the 3D packages 112a-112n. More particularly, for instance, the ITM 104 is configured to determine how the cooling resource actuators 110a-110n are to be manipulated to vary the delivery of cooling resources to the heat sources 114a-114n to maintain the heat load profiles of the heat sources 114a-114n within predetermined ranges. In addition, or alternatively, the ITM 104 is configured to determine how the workloads are to be distributed among the heat sources 114a-114n to maintain the heat load profiles of the heat sources 114a-114n within the predetermined ranges. The ITM 104 is further configured to provide instructions to the CRM 106 and the HSM 108 based upon the matching of the cooling resource actuator 110a-110n capabilities to the heat load profiles of the heat sources 114a-114n. The instructions may include settings for the cooling resource actuators 110a-110n and/or placements of the heat loads among the heat sources 114a-114n to meet both workload and cooling requirements of the heat sources 114a-114n.

The workload and cooling requirements may be determined according to one or more priorities provided by an operator of the management apparatus 102. These priorities may include, for instance, thermal manageability of the 3D packages 112a-112n in which temperatures of the heat sources 114a-114n are maintained below predetermined thresholds. The priorities may also include, for instance, minimizing thermal resistance, increasing energy efficiency, etc.

Figure 2:
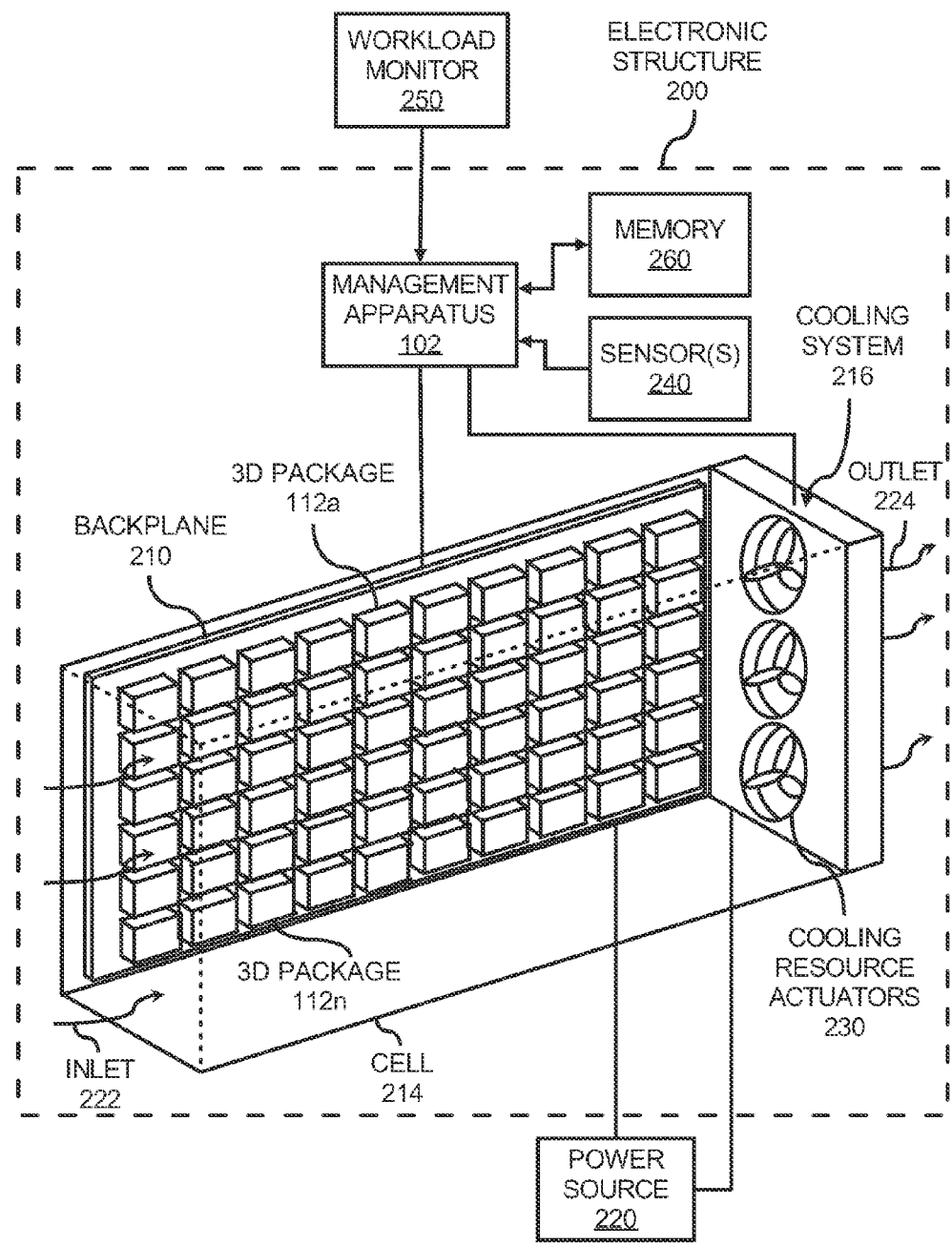
FIG. 2 shows a diagram of an electronic structure in which the infrastructure management system depicted in FIG. 1 may be implemented, according to an embodiment of the invention.

With reference now to FIG. 2, there is shown a diagram of an electronic structure 200 in which the infrastructure management system 100 depicted in FIG. 1 may be implemented, according to an example. It should be understood that the electronic structure 200 may include additional components and that one or more of the components described herein may be removed and/or modified without departing from a scope of the electronic structure 200.

Generally speaking, the electronic structure 200 comprises a plurality of 3D packages 112a-112n arranged on a backplane 210. The 3D packages 112a-112n comprise any of the 3D packages 112a-112n discussed above with respect to FIG. 1. In any regard, the 3D packages 112a-112n may be connected to the backplane 210 through any reasonably suitable means. In one example, the backplane 210 may comprise a printed circuit board substrate having electrical connections to which the 3D packages 112a-112n are connected. In addition, the 3D packages 112a-112n may receive electrical energy from a power source 220, such as, an AC or DC power supply, through the connections made with the backplane 210. In this regard, the backplane 210 may provide both structural support and connectivity to the 3D packages 112a-112n.

The 3D packages 112a-112n and the backplane 210 are depicted as being housed in a cell 214. The cell 214 generally comprises an enclosure configured to, for instance, protect the 3D packages 112a-112n from external conditions. The cell 214 also enables variously configured 3D packages 112a-112n and backplanes to be substantially separated from each other and may thus provide clear delineations between various 3D packages 112a-112n. Alternatively, however, the 3D packages 112a-112n and the backplane 210 may be supported separately from the cell 214. As a further alternative, the cell 214 may house a plurality of backplanes 210 and additional 3D packages 112a-112n on the additional one or more backplanes 210.

The cell 214 may represent a relatively small structure or a relatively large structure. For instance, the cell 214 may have a size similar to a conventional cellular telephone, a size similar to a conventional server, a size similar to a conventional blade server, a size similar to a conventional shipping container, a size similar to either a small or large data center, etc. As such, it should be understood that the various examples discussed herein are applicable to electronic structures 200 having a multitude of different sizes.

The cell 214 is also depicted as including a cooling system 216 having system level cooling resource actuators 230. In the example depicted in FIG. 2, the system level cooling resource actuators 230 comprise fans. It should, however, be understood that the system level cooling resource actuators 230 may comprise other types of cooling mechanisms without departing from a scope of the electronic structure 200 disclosed herein. Examples of other suitable system level cooling resource actuators 230 are described in greater detail herein below. As also discussed in greater detail herein below, the cooling system 216 may also include passive cooling mechanisms, such as, heat sinks, heat pipes, etc., as well as package-level cooling mechanisms. The cooling system 216 and the system level cooling resource actuators 230 receive instructions from the CRM 106.

The electronic structure 200 is depicted as including the management apparatus 102 that is connected to the 3D packages 112a-112n through the backplane 210. The management apparatus 102, as described with respect to FIG. 1 above, includes the ITM 104, the CRM 106, and the HSM 108. As discussed hereinabove, the backplane 210 may include a plurality of electrical connections, similar to a printed circuit board, through which the management apparatus 102 may interact with the 3D packages 112a-112n.

As shown in FIG. 2, the management apparatus 102 is configured to receive input from one or more sensors 240 and a workload monitor 250. The HSM 108 may employ input received from workload monitor 250 in determining and/or predicting the heat load profiles of the 3D packages 112a-112n and/or the heat sources 114a-114n. In addition, the CRM 106 may employ input received from the sensor(s) 240 in determining the capabilities of the cooling resource actuators 110a-110n in meeting the heat load demands of the 3D packages 112a-112n.

The management apparatus 102 may store the received input in a memory 260, which may also comprise one or more of the 3D packages 112a-112n or one or more of the heat sources 114a-114n. In one example, the ITM 104 may access programs or algorithms stored in the memory 260 in determining how one or more of the cooling resource actuators 110a-110n are to be manipulated based upon the data received from the CRM 106 and the HSM 108.

The sensor(s) 240 may be configured and positioned to detect one or more environmental conditions, such as, temperature, vibration, airflow, optical conditions, etc., on or around one or more of the 3D packages 112a-112n. In one example, the sensor(s) 240 may be positioned to detect temperatures at one or more of the 3D packages 112a-112n. This example may include the detection of temperatures within one or more of the 3D packages 112a-112n, such as, in particular locations on the die of the one or more 3D packages, such as, known hot spots of the die, or other locations outside of the 3D packages 112a-112n. In addition or alternatively, the sensor(s) 240 may be positioned at one or more other locations within the cell 214, for instance, at a location to detect the temperature of air flowing through the cell 214 at locations away from the 3D packages 112a-112n. Furthermore, the sensor(s) 240 may be positioned at either or both of an inlet 222 and an outlet 224 of the cell 214. In addition, or alternatively, the sensor(s) 240 may monitor a condition that may be calculated to determine a correlated condition. For instance, the sensor(s) 240 may monitor electrical resistance and may calculate temperature from the monitored electrical resistance.

The workload monitor 250 may comprise, for instance, hardware and/or software configured to at least one of predict and track workloads on the heat sources 114a-114n and to determine which of the 3D packages 112a-112n is capable of performing the requested workloads. The workload monitor 250 may therefore communicate the workload requests to the HSM 108 and the HSM 108 may determine on which of the 3D packages 112a-112n the workloads are to be placed based upon one or more considerations as discussed below. Alternately, the HSM 108 may receive an instruction from the ITM 104 to place the workloads among the heat sources 114a-114n as discussed hereinabove with respect to FIG. 1.

Figure 3A:
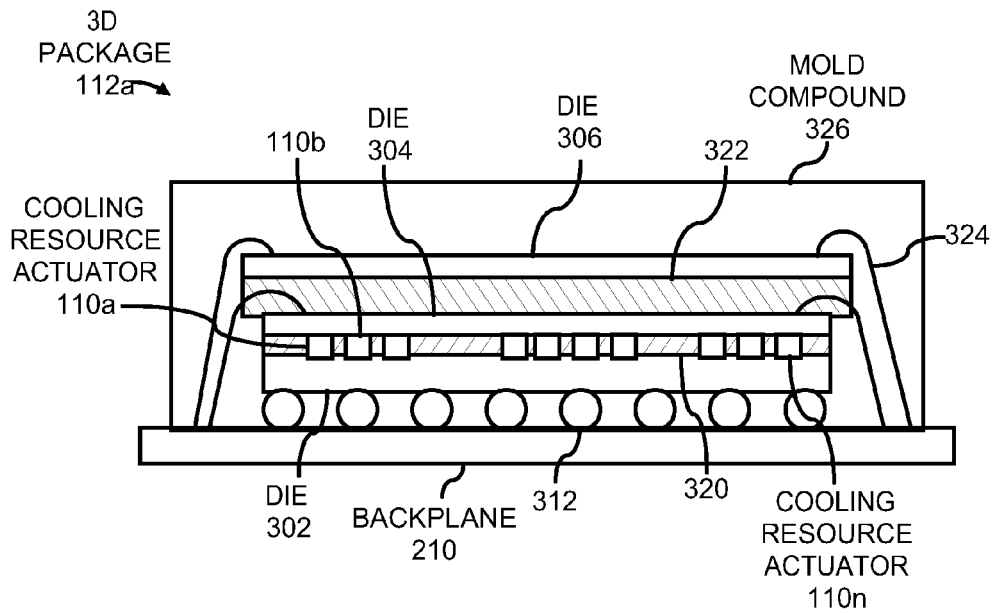
FIGS. 3A and 3B, respectively, depict simplified schematic diagrams of a 3D package containing stacked die and a package level cooling system having cooling resource actuators, according to embodiments of the invention.

Turning now to FIG. 3A, there is shown a simplified schematic diagram of a 3D package 112a containing a plurality of stacked die 302-306 and a package level cooling system having a plurality of package level cooling resource actuators 110a-110n, according to an example. It should be understood that the 3D package 112a may include additional components and that some of the components described herein may be removed and/or modified without departing from a scope of the 3D package 112a described herein.

As shown in FIG. 3A, the 3D package 112a includes a plurality of heat sources 114a-114n, in this instance, a plurality of die 302-306. The die 302-306 may comprise integrated circuit chips configured to perform any reasonably suitable function. By way of example, a first die 302 may comprise a processor die and a second and third die 304 and 206 may comprise flash memory die. In another example, the 3D package 112a may comprise a solid-state memory package, in which the die 302-306 may each comprise flash memories.

The first die 302 is depicted as being mounted on the backplane 210 through a plurality of solder joints 312. Alternatively, however, the first die 302 may be mounted onto a different substrate, which may then be mounted onto the backplane 210. The second die 304 is depicted as being attached to the first die 302 through an adhesive material 320, which may comprise a thermally conductive material. In addition, the third die 306 is depicted as being attached to the second die 304 through another adhesive material 322, which may also comprise a thermally conductive material. The second die 304 and the third die 306 are also depicted as being connected to the backplane 210 through various interconnects 324, which may comprise wirebonds, flip-chip interconnects, photonic interconnects, etc., configured to enable at least one of power and electronic signals to be communicated between the die 304 and 306 and the backplane 210. In addition, or alternatively, the third die 306 may be connected to the second die 304, which is connected to the backplane 210. The die 302-306 are further depicted as being supported within a mold compound 326, which operates to protect the die 302-306 and through which some of the heat generated in the die 302-306 may be dissipated.

In one example, all of the heat generated by the 3D packages 112a-112n may be dissipated through operation of the system level cooling resource actuators 230 (FIG. 2) and may thus not be equipped with active cooling mechanisms 110a-110n. In another example, one or more of the 3D packages 112a-112n may have one or more package level cooling resource actuators 110a-110n, positioned in the adhesive material 320. Although not shown in FIG. 3A, some or all of the cooling resource actuators 110a-110n may be integrated into one or more of the die 302-306 without departing from a scope of the three-dimensional package 112a discussed herein. The package level cooling resource actuators 110a-110n may provide cooling to the 3D packages 112a-112n in addition to the cooling provided by the system level cooling resource actuators 230. In this instance, the system level cooling resource actuators 230 may form one level of a cooling resource hierarchy while the one or more package level cooling resource actuators 110a-110n form another level of the cooling resource hierarchy.

The package level cooling resource actuators 110a-110n may generally be defined as cooling mechanisms that consume electrical energy during their operation and are generally more effective at removing heat as compared with passive cooling mechanisms. The package level cooling resource actuators 110a-110n may therefore be controlled by variations in the electrical energy supplied to the package level cooling resource actuators 110a-110n. According to an example, the package level cooling resource actuators 110a-110n comprise thermoelectric coolers, which include a P-type material plate and an N-type material plate. The P-type material plate and the N-type material plate may operate by the Peltier effect to draw heat from the first die 302 and deliver the heat to the second die 304, which may act to spread the heat. In this example, the package level cooling resource actuators 110a-110n may be electrically connected to the backplane 210 to receive direct current (DC) power.

According to another example, the package level cooling resource actuators 110a-110n comprise one or more other types of cooling mechanisms, such as, cold plates through which a cooling fluid is pumped. In this example, an electronically controllable pump (not shown) may be operated to vary the cooling fluid flow through the cold plates and thereby vary the amount of heat removed from the die 302-306. In addition, or alternatively, the cold plates may include insulating material that may be pumped therethrough to vary the amount of heat transferred between the die 302-306, for instance.

In any regard, the cooling resource actuators 110a-110n may strategically be placed at various locations with respect to the die 302-306. The various locations may include those locations known to dissipate the greatest amount of heat, such as, local hot spots on one or more of the die 302-306. In this regard, heat removal from the die 302-306 may be targeted, thereby substantially optimizing energy efficiency in operating the package level cooling resource actuators 110a-110n.

Although the package level active cooling mechanisms 230a-230n have been depicted as being positioned between the first die 302 and the second die 304, package level cooling resource actuators 110a-110n may also be positioned between the second die 304 and the third die 306, between the first die 302 and the third die 306, across multiple die 302-306, etc. In addition, the 3D package 112a may include any reasonably suitable number of die and package level cooling resource actuators 110a-110n without departing from a scope of the 3D package 112a disclosed herein.

Figure 3B:
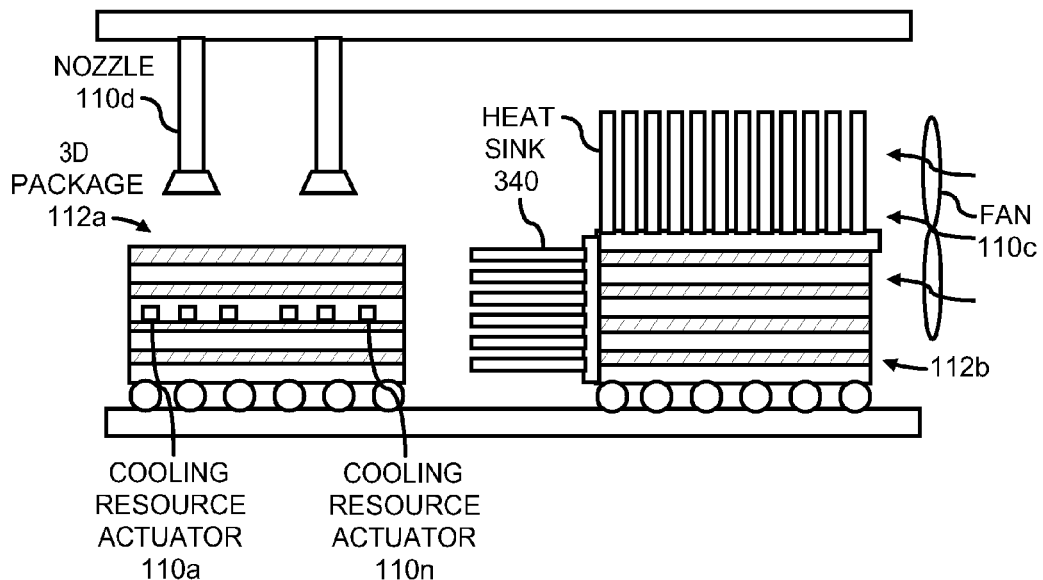

The 3D package 112a may also be equipped with other types of cooling mechanisms, both active and passive. Passive cooling mechanisms may generally be defined as mechanisms that are configured to dissipate heat generated by one or more of the die 302-306 or the 3D package 112a itself, without requiring electrical energy. Some of these active and passive cooling mechanisms are depicted in FIG. 3B. As shown therein, passive cooling mechanisms, such as heat sinks 340 may be positioned along various axes of a 3D package 112a. Although not shown, other types of passive cooling mechanisms, such as, heat pipes, loop thermosiphons, etc., may also be positioned between two or more of the die 302-306 and may be thermally connected to one or more heat sinks 340 to convey heat from the die 302-306 to the one or more heat sinks 340.

As also shown in FIG. 3B, some or all of the cooling resource actuators 110a-110n may be integrally formed with at least one of the die 302-306. The cooling resource actuators 110a-110n are further depicted as including an electronically controllable fan 110c configured to provide airflow to one or more of the 3D packages 112. The fan 110c may comprise an active cooling mechanism in addition to the system level cooling resource actuators 110a-110n depicted in FIG. 2.

The cooling resource actuators 110a-110n may also include one or more nozzles 110d for supplying cooling fluid, either liquid or air, to one or more of the 3D packages 112a-112n. In one example, the nozzles 110d may be configured and operated to provide substantially precise delivery of the cooling fluid to desired locations on the 3D packages 112a-112n. In another example, the nozzles 110d may be controlled to deliver the cooling fluid according to the amount of heat generated in the 3D packages 112a-112n.

It should be understood that the various 3D package 112a and cooling provisioning configurations shown in FIG. 3B may be modified without departing from a scope of the 3D package 112a and cooling provisioning discussed herein.

Figure 4A:
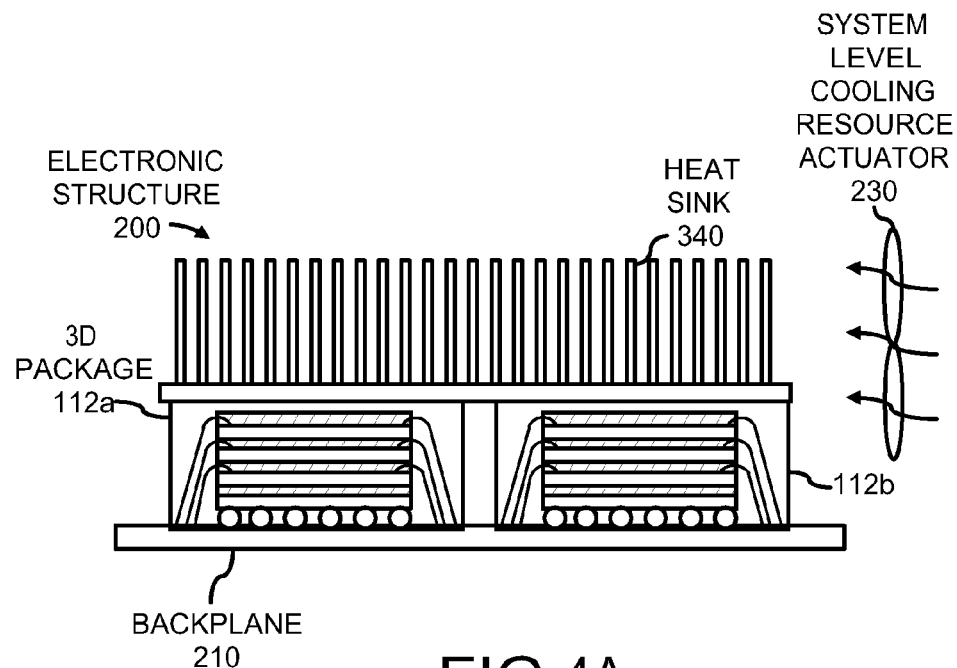
FIGS. 4A-4C, respectively, show simplified schematic diagrams of part of the electronic structure depicted in FIGS. 3A and 3B, according to embodiments of the invention.
Figure 4B:
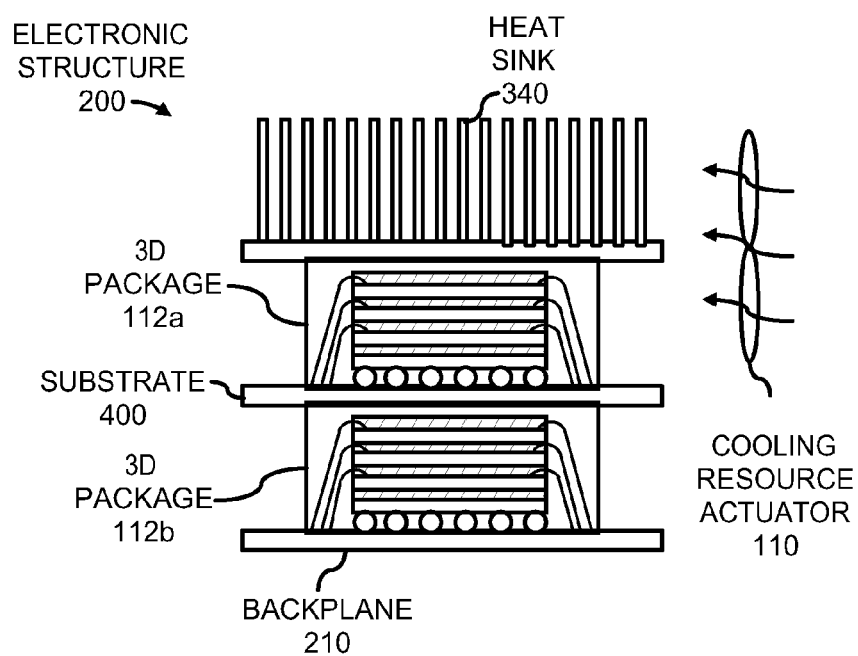
Figure 4C:
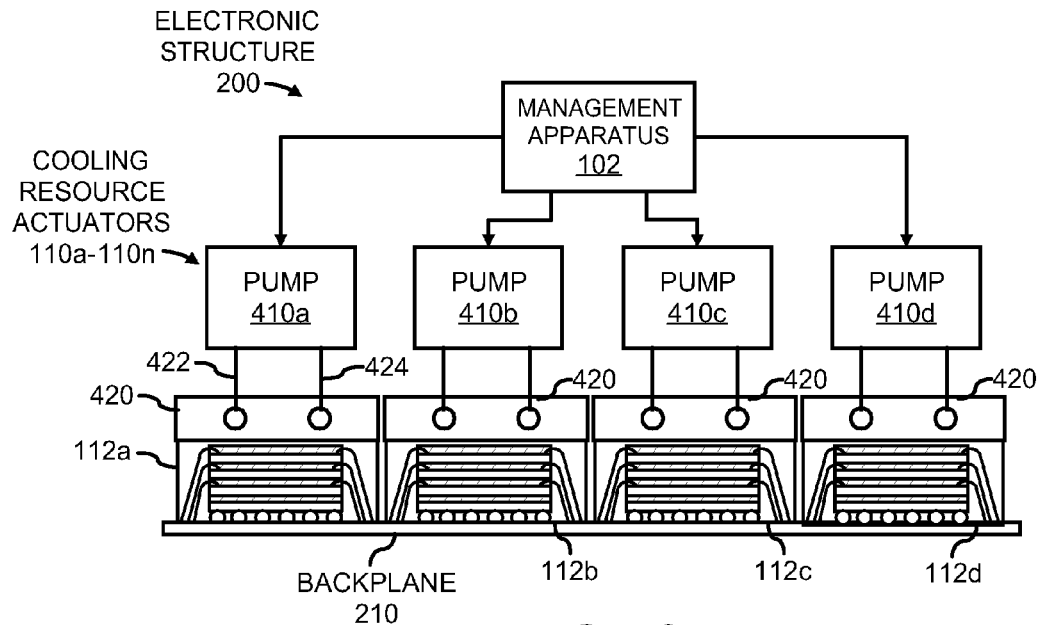

Turning now to FIGS. 4A-4C, there are shown simplified schematic diagrams of part of the electronic structure 200, according to three examples. It should be understood that the electronic structure 200 may include additional components and that some of the components described herein may be removed and/or modified without departing from a scope of the electronic structure 200 described herein. For instance, the electronic structures 200 depicted in FIGS. 4A-4C may include any reasonably suitable number of 3D packages 112a-112n arranged in any reasonably suitable configuration.

With reference first to FIG. 4A, the electronic structure 200 is depicted as including a plurality of 3D packages 112a, 112b arranged across the backplane 210. Also shown in FIG. 4A is a heat sink 340 that spans across multiple ones of the 3D packages 112. In this configuration, for instance, the heat generated by the 3D packages 112 may be dissipated through airflow flowing through the heat sink 340 caused by the cooling resource actuators 110.

With reference now to FIG. 4B, the electronic structure 200 is depicted as including a 3D package 112a that is stacked on top of another 3D package 112b. A substrate 400 is also depicted as being positioned between the 3D packages 112. The substrate 400 may be electrically connected to the backplane 210 to enable control signals and power to be delivered to the upper 3D package 112a. In addition, the upper 3D package 112a is depicted as including a heat sink 340 for dissipating heat generated by both of the 3D packages 112a and 112b. In this example, heat generated by the lower 3D package 112b may be conveyed through the upper 3D package 112a and into the heat sink 340 where it is dissipated. Alternatively, however, heat pipes or other heat transfer devices (not shown) may be positioned to convey the heat directly from the lower 3D package 112b to the heat sink 340. In addition, although not explicitly shown, one or more package level cooling resource actuators 110a-110n may be provided in the 3D packages 112a and 112b.

Turning now to FIG. 4C, the electronic structure 200 is depicted as including a plurality of 3D packages 112a-112d arranged along the backplane 210. In addition, the cooling resource actuators 110a-110n are depicted as a plurality of pumps 410a-410d and a plurality of cold plates 420. The pumps 410a-410d also include an inlet line 422 and an outlet line 424 that the pumps 410a-410d may use to deliver and remove cooling fluid, such as, water, a refrigerant, etc., into and out of the cold plates 420. In this regard, the cold plates 420 are configured with channels (not shown) through which the cooling fluid flows to remove heat dissipated by the 3D packages 112a-112d.

The pumps 410a-410d are also depicted as being controlled by the management apparatus 102. Thus, for instance, the ITM 104 may control the CRM 106 to vary the operations of the pumps 410a-410d in a substantially individual basis to ensure that each of the 3D packages 112a-112d receives adequate amounts of cooling. In addition, or alternatively, the ITM 104 may control the HSM 108 to vary the placements of workloads among various heat sources 114a-114n of the 3D packages 112a-112d to substantially ensure that the pumps 410a-410d are capable of adequately removing heat dissipated by the 3D packages 112a-112d.

Some or all of the embodiments depicted in FIGS. 4A-4C may be used together in the same cell 214. In this regard, the cell 214 may include various regions of 3D packages 112a-112n that require different levels of cooling. For instance, a first region of the cell 214 may include 3D packages 112a-112n configured to generate relatively lower amounts of heat and a second region of the cell 214 may include 3D packages 112a-112n configured to generate relatively higher amounts of heat. In this example, the 3D packages 112a-112n located in the first region may be equipped with heat sinks 340, as depicted in FIGS. 4A and 4B and the 3D packages 112a-112n located in the second region may be equipped with the cooling resource actuators 110 depicted in FIG. 4C.

Figure 5:
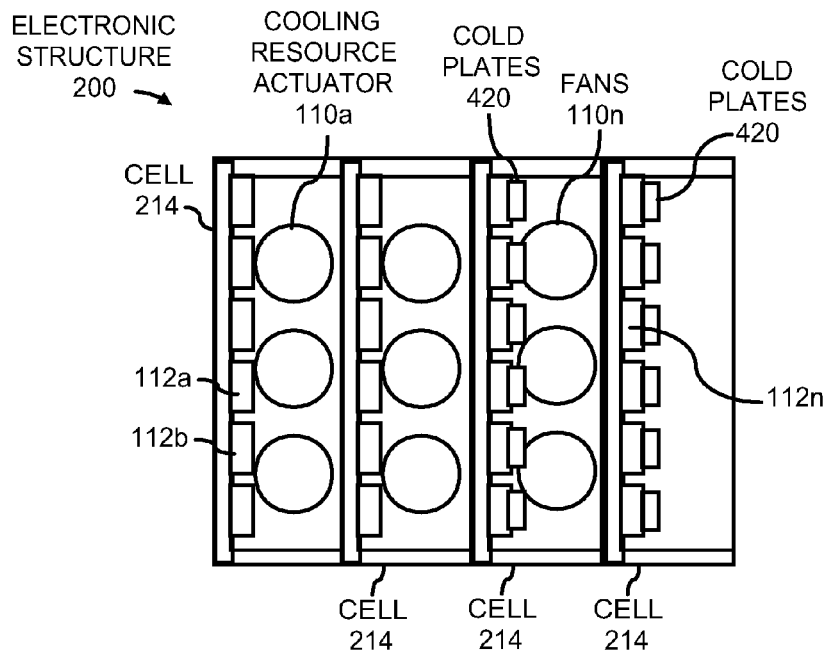
FIG. 5 depicts a simplified schematic illustration of the electronic structure depicted in FIG. 2 composed of four cells, according to an embodiment of the invention.

In addition, or alternatively, the electronic structure 200 may include a plurality of cells 214, where the cells 214 may include different cooling resource actuators 110a-110n arrangements as depicted in FIG. 5. FIG. 5, more particularly, depicts a simplified schematic illustration of an electronic structure 200 composed of four cells 214, according to an example. Although four cells 214 have been depicted in FIG. 5, it should be understood that the electronic structure 200 may include any reasonably suitable number of cells, including a single cell, without departing from a scope thereof.

As shown in FIG. 5, the first two cells 214 from the left include the cooling resource actuators 110a-110n depicted in FIG. 2. The third cell 214 includes a combination of cooling resource actuators 110a-110n, including fans and cold plates 420. The fourth cell 214 includes the cold plates 420 without fans.

According to an example, the 3D packages 112a-112n are arranged in one or more of the cells 214 and/or in various regions of one or more of the cells 214 based upon a characteristic of the 3D packages 112a-112n, such as, density, criticalities of workloads performed by the 3D packages 112a-112n, etc. More particularly, for instance, the 3D packages 112a-112n are arranged in a predetermined configuration based upon a categorization of the 3D packages 112a-112n, such as, hierarchically, according to desired workload performance capabilities, etc. In this example, the 3D packages 112a-112n may be categorized according to their respective characteristics. Various manners in which the 3D packages 112a-112n may be arranged in the one or more cells 214 are discussed in the PCT/US08/59020 application.

Figure 6:
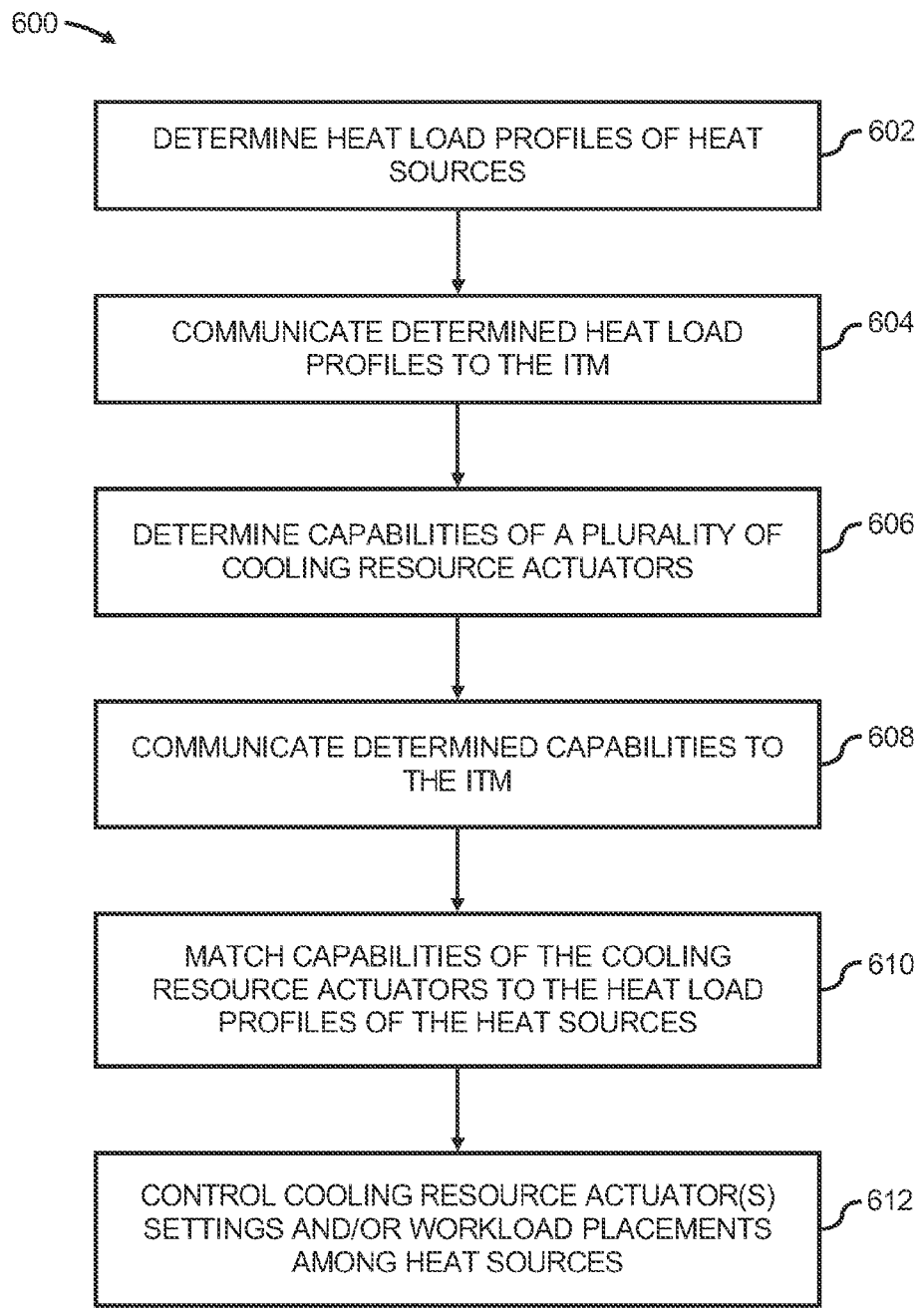
FIG. 6 shows a flow diagram of a method for managing an infrastructure having one or more 3D packages and cooling resource actuators, each of the 3D packages including heat sources, according to an embodiment of the invention.

Turning now to FIG. 6, there is shown a flow diagram of a method 600 for managing an infrastructure having one or more 3D packages 112a-112n and a plurality of cooling resource actuators 110a-110n, each of the 3D packages 112a-112n including a plurality of heat sources 114a-114n, according to an example. It should be understood that the method 600 may include additional steps and that one or more of the steps described herein may be removed and/or modified without departing from a scope of the method 600.

The description of the method 600 is made with reference to the electronic structures 200 depicted in FIGS. 1-5 and thus makes particular reference to the elements contained in the electronic structure 200 depicted therein. It should, however, be understood that the method 600 may be implemented in an electronic structure that differs from the electronic structure 200 without departing from a scope of the method 600.

At step 602, heat load profiles of the heat sources 114a-114n of one or more 3D packages 112a-112n are determined, for instance, by the HSM 108. For instance, the HSM 108 may determine heat dissipation levels of the heat sources 114a-114n in various manners as discussed above with respect to FIG. 1.

At step 604, the heat load profiles determined for the heat sources 114a-114n are communicated to the ITM 104. In addition, or alternatively, the heat load profiles determined for the heat sources 114a-114n are communicated to the CRM 106 at step 604.

At step 606, capabilities of the cooling resource actuators 110a-110n to meet heat load demands of the heat sources 114a-114n based on the heat load profiles of the heat sources 114a-114n are determined, for instance, by the CRM 106. For instance, the CRM 106 may determine the capabilities of the cooling resource actuators 110a-110n to meet the heat load demands of the heat sources 114a-114n in various manners as discussed above with respect to FIG. 1. As also discussed above with respect to FIG. 1, the cooling resource actuators 110a-110n may comprise heterogeneous actuators with respect to each other.

At step 608, the determined capabilities of the cooling resource actuators 110a-110n to meet the heat load demands of the heat sources 114a-114n are communicated to the ITM 104.

At step 610, the capabilities of the cooling resource actuators 110a-110n are matched to the heat load profiles of the heat sources 114a-114n, for instance, by the ITM 104. More particularly, for instance, the capabilities of the cooling resource actuators 110a-110n may be matched to the heat load profiles of the heat sources 114a-114n through a determination of at least one of settings for the cooling resource actuators 110a-110n and placements of the heat loads among the heat sources 114a-114n to meet both workload and cooling requirements of the one or more 3D packages 112a-112n. By way of particular example, the ITM 104 may determine settings for the cooling resource actuators 110a-110n that results in conditions around the heat sources 114a-114n being within predetermined ranges, based upon current or predicted workloads on the heat sources 114a-114n. As another example, the ITM 104 may determine an arrangement for the placement of workloads among the heat sources 114a-114n that results in the expected heat dissipation levels of the heat sources 114a-114n to fall within the capabilities of the cooling resource actuators 110a-110n. As a further example, the ITM 104 may determine both settings for the cooling resource actuators 110a-110n and workload placements among the heat sources 114a-114n that results in the expected heat dissipation levels of the heat sources 114a-114n to fall within the capabilities of the cooling resource actuators 110a-110n.

The capabilities of the cooling resource actuators 110a-110n may be matched to the heat load profiles of the heat sources 114a-114n through any of a number of various approaches. Under a first approach, the HSM 108 is configured to hierarchically arrange loads on the heat sources 114a-114n, for instance, according to the projected heat loads on the heat sources 114a-114n. Under this approach, the CRM 106 is also configured to hierarchically arrange the cooling resource actuators 110a-110n according to their capabilities, for instance, according to available cooling capacities. In addition, the ITM 104 is configured to match the heat sources 114a-114n and the cooling resource actuators 110a-110n based on the hierarchical arrangement of the loads on the heat sources 114a-114n and the hierarchical arrangement of the cooling resource actuators 110a-110n.

Thus, under this approach, for instance, the ITM 104 is configured to match the highest heat dissipating heat source 114a with the highest cooling capacity cooling resource actuator 110a, the second-highest heat dissipating heat source 114b with the second-highest cooling capacity cooling resource actuator 110b, etc. In addition, the ITM 104 may match the heat sources 114a-114n and the cooling resource actuators 110a-110n while substantially ensuring that under no circumstances does the expected heat dissipation levels of the heat sources 114a-114n exceed the available thermal capacities of the cooling resource actuators 110a-110n.

Further, the ITM 104 may be configured to ensure that expected heat dissipation does not exceed the available thermal capacity in each level of the hierarchy. The CRM 106 may add additional cooling resource actuators 110a-110n to each level of the hierarchically in response to a determination by the ITM 104 that an expected heat dissipation of the projected load of the hierarchically identified heat sources 114a-114n exceeds a capacity of the matching hierarchically identified cooling resource actuators 110a-110n. For instance, if the ITM 104 determines that a capacity violation will occur at a particular hierarchical level with the current configuration and actuation of the cooling resource actuators 110a-110n, then the CRM 106 may add one or more new cooling resource actuators 110a-110n to that level of the hierarchy.

Under another approach, the ITM 104 is configured to mitigate failures of at least one of the heat sources 114a-114n and the cooling resource actuators 110a-110n by at least one of reallocating heat loads and manipulating cooling resource delivery in the event of a failure in at least one of the heat sources 114a-114n or the cooling resource actuators 110a-110n.

Under a further approach, the HSM 108 groups multiple ones of the heat sources 114a-114n into a sub-system heat source. In this approach, the ITM 104 matches the sub-system heat source to one of the cooling resource actuators 110a. For example, two die may be stacked face-to-face and then share the same microchannel cooling resource actuator 110a. Further, the HSM 108 may be configured to determine an allocation of workloads across multiple heat sources 114a-114n that maintains all of the heat sources 114a-114n within an available cooling capacity constraint. For instance, the HSM 108 may scale back or divide heat-dissipating workloads across multiple heat sources 114a-114n based upon the grouping of the heat sources 114a-114n.

Under a further approach, the CRM 106 groups multiple ones of the cooling resource actuators 110a-110n into a single heat-removing sub-system. In this approach, the ITM 104 is configured to match the single heat-removing sub-system to a heat source 114a. This approach may be used for, for instance, high-capacity heat sources 114a-114n. For example, a thermoelectric device in between two stacked chips with microchannels etched on the back side may be used to cool a single high-density device.

According to an embodiment, the ITM 104 may match the heat sources 114a-114n and the cooling resource actuators 110a-110n while substantially ensuring that under no circumstances does the expected heat dissipation levels of the heat sources 114a-114n exceed the available thermal capacities of the cooling resource actuators 110a-110n. However, if a determination that a cooling capacity constraint has been or is predicted to be violated, the ITM 104 may vary the matching between the multiple cooling resource actuators 110a-110n and the heat sources 114a-114n and cause the HSM 108 to postpone allocation of workloads related to any unassigned cooling resource actuators 110a-110n. In addition, the ITM 104 may assign workloads sequentially rather than concurrently to thus reduce the amount of cooling resources required at a given time. Alternatively, the ITM 104 may reduce or divide the loads across multiple heat sources 114a-114n to thereby reduce the heat dissipation levels at any given heat source 114a-114n such that the heat dissipation levels of none of the heat sources 114a-114n exceeds the available cooling capacity for the heat sources 114a-114n.

According to another embodiment, the ITM 104 is configured to manage each heat source 114a-114n and each cooling resource actuator 110a-110n as agents under an effective trading scheme, such that a total number of resources required by each agent is satisfied by another agent. For instance, to optimize the infrastructure management system 100 under the effective trading scheme, the ITM 104 may preliminarily assign loads to each heat-dissipating and cooling agent. The effective trading scheme may also be enacted by arbitrary or numerical shifting of heat-dissipating and/or cooling loads, with iterative matching verification for the needs of each agent. The ITM 104 may use numerical difference schemes to ensure convergence under well-posed definitions for each trade that occurs within the effective trading scheme.

According to another embodiment, the ITM 104 is configured to substantially maintain conditions at the heat sources 114a-114n within predetermined ranges while substantially optimizing a measure of performance associated with supplying the cooling resources to the plurality of locations. For instance, both the HSM 108 and the CRM 106 may determine a coefficient of performance (COP) based on actuations of the cooling resource actuators 110a-110n and the heat sources 114a-114n. In addition, the HSM 108 and the CRM 106 may be configured to perform optimization to improve the COP. For instance, the HSM 108 may determine an allocation of the workload among the heat sources that improves the COP. The ITM 104 may thereafter receive the COPs from the HSM 108 and the CRM 106 and determine at least one of an actuation of the cooling resource actuators 110a-110n and placement of loads on the heat sources 114a-114n that substantially maximizes the COP.

The management apparatus 102 may also be configured to optimize the management of the infrastructure contained in the system 100 by iterating any of the approaches disclosed hereinabove with respect to the CRM 106 and the HSM 108 to minimize energy used in operating and cooling the heat sources 114a-114n, and/or maximize performance of the heat sources 114a-114n and the cooling resource actuators 110a-110n. The management apparatus 102 may also be configured to minimize the cost of constructing an infrastructure containing one or more 3D packages 112a-112n and multiple cooling resource actuators 110a-110n.

At step 612, at least one of the settings of the cooling resource actuators 110a-110n and the placement of the workloads among the heat sources 114a-114n is controlled according to the determinations made at step 610. By way of example, the ITM 104 is configured to communicate instructions to one or both of the CRM 106 and the HSM 108 based upon the determinations made at step 610.

Some or all of the operations set forth in the figures may be contained as a utility, program, or subprogram, in one or more computer readable storage mediums. In addition, the operations may be embodied by computer programs, which can exist in a variety of forms both active and inactive. For example, they may exist as software program(s) comprised of program instructions in source code, object code, executable code or other formats. Any of the above may be embodied on a computer readable storage medium, which include storage devices.

Exemplary computer readable storage devices include conventional computer system random access memory (RAM), read-only memory (ROM), erasable programmable read-only memory (EPROM), electrically erasable programmable read-only memory (EEPROM), and magnetic or optical disks or tapes. Concrete examples of the foregoing include distribution of the programs on a compact disc read only memory (CD ROM) or via Internet download. It is therefore to be understood that any electronic device capable of executing the above-described functions may perform those functions enumerated above.

Figure 7:
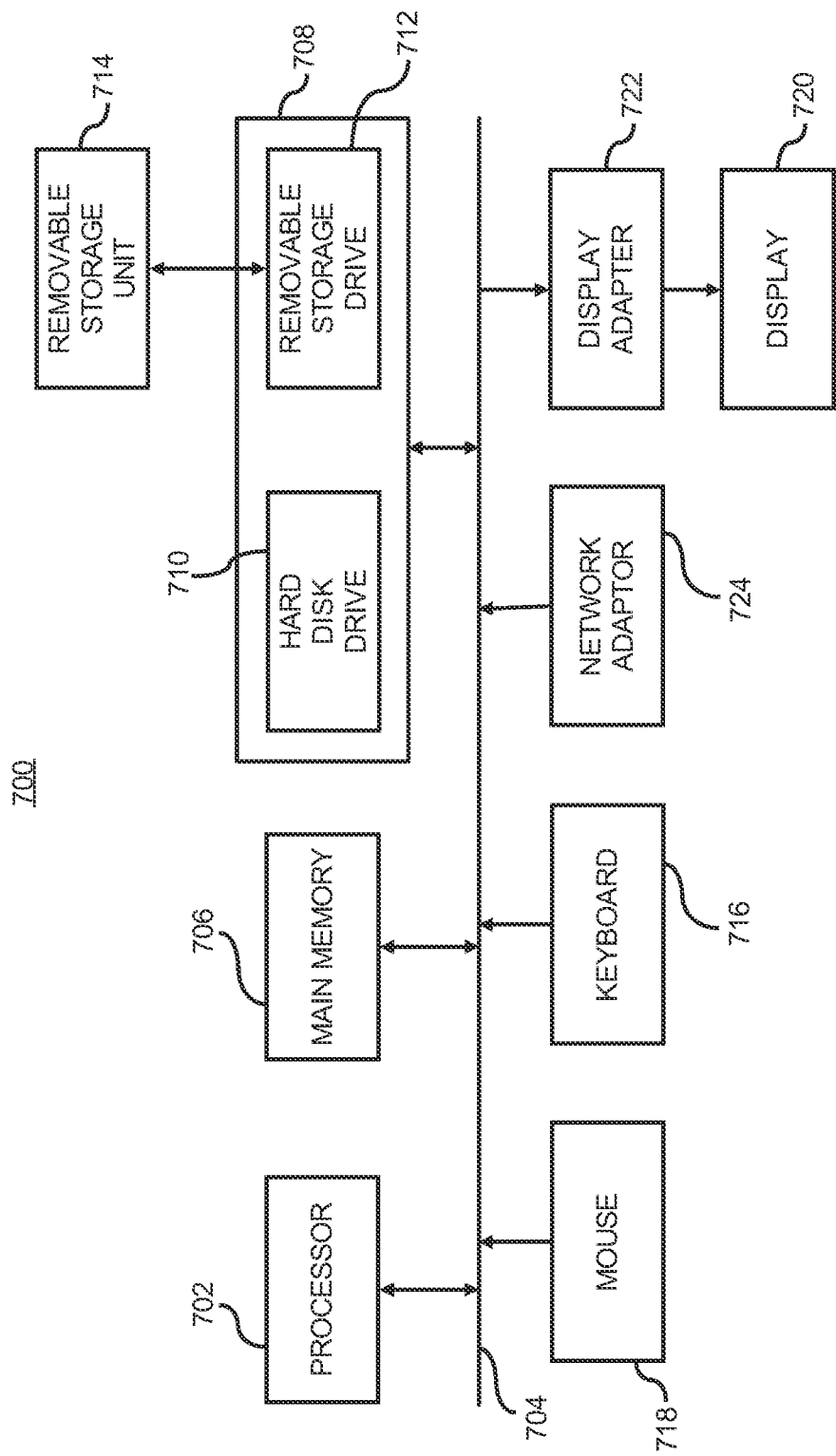
FIG. 7 illustrates a computer system, which may be employed to perform various functions of the management apparatus depicted in FIG. 1, according to an embodiment of the invention.

FIG. 7 illustrates a computer system 700, which may be employed to perform the various functions of the management apparatus 102 described herein above with respect to FIG. 1, according to an example. In this respect, the computer system 700 may be used as a platform for executing one or more of the functions described hereinabove with respect to the management apparatus 102.

The computer system 700 includes a processor 702, which may be used to execute some or all of the steps described in the method 600. Commands and data from the processor 702 are communicated over a communication bus 704. The computer system 700 also includes a main memory 706, such as a random access memory (RAM), where the program code may be executed during runtime, and a secondary memory 708. The secondary memory 708 includes, for example, one or more hard disk drives 710 and/or a removable storage drive 712, representing a floppy diskette drive, a magnetic tape drive, a compact disk drive, etc., where a copy of the program code for managing an infrastructure having one or more three-dimensional (3D) packages and a plurality of cooling resource actuators, each of the 3D packages including a plurality of heat sources 114a-114n.

The removable storage drive 710 reads from and/or writes to a removable storage unit 714 in a well-known manner. User input and output devices may include a keyboard 716, a mouse 718, and a display 720. A display adaptor 722 may interface with the communication bus 704 and the display 720 and may receive display data from the processor 702 and convert the display data into display commands for the display 720. In addition, the processor 702 may communicate over a network, for instance, the Internet, LAN, etc., through a network adaptor 724.

It will be apparent to one of ordinary skill in the art that other known electronic components may be added or substituted in the computer system 700. In addition, the computer system 700 may include a system board or blade used in a rack in a data center, a conventional "white box" server or computing device, etc. Also, one or more of the components in FIG. 7 may be optional (for instance, user input devices, secondary memory, etc.).

What has been described and illustrated herein is a preferred embodiment of the invention along with some of its variations. The terms, descriptions and figures used herein are set forth by way of illustration only and are not meant as limitations. Those skilled in the art will recognize that many variations are possible within the scope of the invention, which is intended to be defined by the following claims—and their equivalents—in which all terms are meant in their broadest reasonable sense unless otherwise indicated.

What is claimed is:

1. An apparatus for managing an infrastructure having one or more three-dimensional (3D) packages and a plurality of cooling resource actuators, each of the 3D packages including a plurality of heat sources, the apparatus comprising:
   a heat source manager device configured to determine heat load profiles of the heat sources;
   a cooling resource manager device configured to determine capabilities of the plurality of cooling resource actuators to meet heat load demands of the plurality of heat sources based on the heat load profiles of the plurality of heat sources; and
   an integrated thermal manager device configured to match the capabilities of the plurality of cooling resource actuators to the heat load profiles of the plurality of heat sources.

2. The apparatus according to claim 1, wherein the plurality of cooling resource actuators comprise a plurality of heterogeneous cooling resource actuators configured to vary delivery of the cooling resources to the one or more 3D packages in heterogeneous manners with respect to each other.

3. The apparatus according to claim 1, wherein the heat source manager is further configured to communicate the determined heat load profiles of the plurality of heat sources to the integrated thermal manager, wherein the cooling resource manager is configured to communicate the capabilities of the plurality of cooling resource actuators to meet the heat load demands of the one or more 3D packages to the integrated thermal manager, and wherein the integrated thermal manager is configured to match the capabilities of the plurality of cooling resource actuators to the heat load profiles of the plurality of heat sources by determining at least one of settings for the plurality of cooling resource actuators and placements of the heat loads among the heat sources to meet both workload and cooling requirements of the one or more 3D packages.

4. The apparatus according to claim 1, wherein the heat source manager is configured to hierarchically arrange loads on the plurality of heat sources, wherein the cooling resource manager is configured to hierarchically arrange the cooling resource actuators according to capabilities of the cooling resource actuators, and wherein the integrated thermal manager is configured to match the plurality of heat sources and the cooling resource actuators based on the hierarchical arrangement of the loads on the plurality of heat sources and the hierarchical arrangement of the cooling resource actuators.

5. The apparatus according to claim 1, wherein the integrated thermal manager is configured to match the capabilities of the plurality of cooling resource actuators to the heat load profiles of the plurality of heat sources to ensure that expected heat dissipation levels of the plurality of heat sources fall within the capabilities of the plurality of cooling resource actuators.

6. The apparatus according to claim 1, wherein the heat source manager is configured to group multiple ones of the plurality of heat sources into a sub-system heat source, and wherein the integrated thermal manager is configured to match the sub-system heat source to one of the plurality of cooling resource actuators.

7. The apparatus according to claim 1, wherein the cooling resource manager is configured to group multiple ones of the cooling resource actuators into a single heat removing sub-system and wherein the integrated thermal manager is configured to match the single heat removing sub-system to one of the plurality of heat sources.

8. The apparatus according to claim 1, wherein the heat source manager is configured to operate the plurality of heat sources as agents and the cooling resource manager is configured to operate the plurality of cooling resource actuators as agents under a predefined trading scheme.

9. The apparatus according to claim 1, wherein the integrated thermal manager is configured to maintain conditions at the plurality of heat sources within predetermined ranges while optimizing at least one measure of performance associated with delivering the cooling resources to the plurality of heat sources to substantially maintain the conditions within the predetermined ranges.

10. The apparatus according to claim 1, wherein the integrated thermal manager is configured to mitigate failures of at least one of the plurality of heat sources and the plurality of cooling resource actuators by at least one of reallocating heat loads and manipulating cooling resource delivery in the event of a failure.

11. A method for managing an infrastructure having one or more three-dimensional (3D) packages and a plurality of cooling resource actuators, each of the 3D packages including a plurality of heat sources, the method comprising:
determining heat load profiles for the plurality of heat sources;
determining capabilities of a plurality of cooling resource actuators to meet heat load demands of the plurality of heat sources based on the heat load profiles of the plurality of heat sources; and
matching the capabilities of the plurality of cooling resource actuators to the heat load profiles of the plurality of heat sources.

12. The method according to claim 11, wherein the plurality of cooling resource actuators comprise a plurality of heterogeneous cooling resource actuators configured to vary delivery of the cooling resources to the one or more 3D packages in heterogeneous manners with respect to each other, said method further comprising:
employing a heat source manager to determine the heat load profiles of the plurality of heat sources;
employing a cooling resource manager to determine the capabilities of the plurality of cooling resource actuators; and
employing an integrated thermal manager to match the capabilities of the plurality of cooling resource actuators to the heat load profiles of the plurality of heat sources.

13. The method according to claim 11, wherein matching the capabilities of the plurality of cooling resource actuators to the heat load profiles of the plurality of heat sources further comprises matching the capabilities of the plurality of cooling resource actuators to the heat load profiles of the plurality of heat sources by determining at least one of settings for the plurality of cooling resource actuators and placements of the heat loads among the heat sources to meet both workload and cooling requirements of the one or more 3D packages.

14. The method according to claim 11, wherein matching the capabilities of the plurality of cooling resources to the heat load profiles of the plurality of heat sources further comprises matching the capabilities of the plurality of cooling resources to the heat load profiles of the plurality of heat sources according to a hierarchical arrangement of the cooling resource actuators and a hierarchical assignment of the workloads on the heat sources.

15. The method according to claim 11, further comprising:
grouping multiple ones of the plurality of heat sources into a sub-system heat source; and
matching the sub-system heat source to one of the plurality of cooling resource actuators.

16. The method according to claim 11, further comprising:
grouping multiple ones of the plurality of cooling resource actuators into a single heat removing sub-system; and
matching the single heat removing sub-system to one of the plurality of heat sources.

17. The method according to claim 11, further comprising:
determining that a cooling capacity constraint is or is predicted to be violated; and
re-matching the capabilities of the plurality of cooling resource actuators to the heat load profiles of the heat sources in response to the cooling capacity constraint being or being predicted to be violated.

18. The method according to claim 11, further comprising:
mitigating failures of at least one of the plurality of heat sources and the plurality of cooling resource actuators by at least one of reallocating heat loads and manipulating cooling resource delivery in the event of failure in at least one of the plurality of heat sources and the plurality of cooling resource actuators.

19. The method according to claim 11, further comprising:
maintaining conditions at the plurality of heat sources within predetermined ranges while optimizing at least one measure of performance associated with delivering the cooling resources to the plurality of heat sources.

20. A computer readable storage medium on which is embedded one or more computer programs, said one or more computer programs implementing a method for managing an infrastructure having one or more three-dimensional (3D) packages and a plurality of heterogeneous cooling resource actuators, each of the 3D packages including a plurality of heat sources, said one or more computer programs comprising computer readable code for:
determining heat load profiles for the plurality of heat sources;
determining capabilities the plurality of heterogeneous cooling resource actuators to meet heat load demands of the plurality of heat sources based on the heat load profiles of the plurality of heat sources; and
matching the capabilities of the plurality of cooling resource actuators to the heat load profiles of the plurality of heat sources.

* * * * *